United States Patent
Anderson et al.

(10) Patent No.: US 9,861,004 B2
(45) Date of Patent: Jan. 2, 2018

(54) ZERO-U RACK KEYBOARD AND MONITOR

(71) Applicant: International Business Machines Corporation, Armonk, NY (US)

(72) Inventors: Dale H. Anderson, Tucson, AZ (US); Angel E. Delgado, Vail, AZ (US); Eric A. Eckberg, Rochester, MN (US); John C. Elliott, Tucson, AZ (US); Markus A. Navarro, Tucson, AZ (US); Scott A. Shurson, Mantorville, MN (US); Will A. Wright, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/958,710

(22) Filed: Dec. 3, 2015

(65) Prior Publication Data
US 2017/0164506 A1 Jun. 8, 2017

(51) Int. Cl.
| H05K 5/00 | (2006.01) |
| H05K 7/16 | (2006.01) |
| H02B 1/20 | (2006.01) |
| H05K 7/14 | (2006.01) |
| G06F 1/16 | (2006.01) |

(52) U.S. Cl.
CPC ......... *H05K 7/1489* (2013.01); *G06F 1/1613* (2013.01); *G06F 1/1662* (2013.01); *H05K 7/1488* (2013.01); *H05K 7/1494* (2013.01); *G06F 1/1637* (2013.01)

(58) Field of Classification Search
CPC ..... G06F 1/181; G06F 1/1637; H05K 7/1488; H05K 7/1489; H05K 7/1494; H05K 7/183

USPC ...... 361/724–727, 825, 826, 679.01–679.45, 361/679.55–679.59; 211/26; 312/223.1, 312/223.2
See application file for complete search history.

(56) References Cited

U.S. PATENT DOCUMENTS

| 5,833,337 A  * | 11/1998 | Kofstad ............... H05K 7/1489 |
| | | 211/175 |
| 6,061,966 A | 5/2000 | Nelson et al. |
| 6,305,556 B1 * | 10/2001 | Mayer ....................... G06F 1/18 |
| | | 211/175 |
| 6,483,695 B1 * | 11/2002 | Hartstein .............. F25D 29/005 |
| | | 361/679.09 |
| 6,621,692 B1 | 9/2003 | Johnson et al. |
| 6,666,340 B2 * | 12/2003 | Basinger ................ A47B 88/43 |
| | | 211/175 |
| 6,961,246 B2 * | 11/2005 | Dickey .................... G06F 1/181 |
| | | 248/286.1 |
| 7,016,191 B2 | 3/2006 | Miyamoto et al. |

(Continued)

FOREIGN PATENT DOCUMENTS

JP 2006223364 A 8/2006

OTHER PUBLICATIONS

Gibson et al., "Rack Mountable Service Access Drawer," IP.com, IBM, Feb. 1, 1991, 1 page.

*Primary Examiner* — Nidhi Thaker
(74) *Attorney, Agent, or Firm* — Zilka-Kotab, P.C.

(57) ABSTRACT

In one general embodiment, a server rack is provided. The server rack includes a sidewall and an aperture in the sidewall. The server rack also includes a first fixed rail within the sidewall, and a second fixed rail within the sidewall. Moreover, the server rack includes a retractable terminal configured to extend through the aperture of the sidewall.

17 Claims, 18 Drawing Sheets

(56) References Cited

U.S. PATENT DOCUMENTS

| | | | |
|---|---|---|---|
| 7,256,986 B2 | 8/2007 | Williams et al. | |
| 7,527,155 B2* | 5/2009 | McClain | G06F 1/181 |
| | | | 211/126.2 |
| 7,591,383 B1* | 9/2009 | Milton | G06F 1/1601 |
| | | | 211/26 |
| 7,808,795 B2* | 10/2010 | Lu | H05K 7/1491 |
| | | | 312/223.1 |
| 7,894,194 B2 | 2/2011 | Shih et al. | |
| 8,018,716 B2* | 9/2011 | McCoy | F16M 11/08 |
| | | | 248/917 |
| 2005/0173357 A1* | 8/2005 | McClain | G06F 1/181 |
| | | | 211/26 |
| 2006/0056148 A1* | 3/2006 | Miyamoto | G11B 33/144 |
| | | | 361/679.33 |
| 2006/0125358 A1* | 6/2006 | Williamson | H05K 7/1494 |
| | | | 312/223.1 |
| 2007/0210686 A1* | 9/2007 | Adducci | A47B 81/00 |
| | | | 312/265.2 |
| 2008/0123284 A1* | 5/2008 | Jaramillo | G06F 1/1601 |
| | | | 361/679.1 |
| 2009/0101603 A1* | 4/2009 | Hilburn | H05K 7/1489 |
| | | | 211/26 |
| 2010/0328872 A1* | 12/2010 | Chou | H05K 7/1494 |
| | | | 361/679.08 |
| 2014/0027392 A1* | 1/2014 | Crippen | H05K 7/1488 |
| | | | 211/26 |

* cited by examiner

ZERO-U RACK KEYBOARD AND MONITOR

BACKGROUND

The present invention relates to computer hardware, and more particularly, this invention relates to rack systems.

Server racks or cabinets are a common fixture in modern data centers, Internet Service Provider (ISP) facilities, and corporate server rooms. The traditional server rack is a frame or enclosure of standardized dimensions to allow the customization via modular components. Such racks allow for dense and highly-customizable data-processing hardware configurations without occupying excessive floor space.

Performing the administration or maintenance of hardware in a server rack often requires a user input device, such as a keyboard and/or mouse, and a display. Floor space is often limited in server rooms, so any space within the racks is considered valuable and is also limited. Accordingly, the installation of input devices and displays within a rack may undesirably reduce the available rack space for data-processing hardware. Further, the installation of input devices and displays within a door of the rack may block airflow and impede cooling of the electronics in the rack.

SUMMARY

In one general embodiment, a server rack is provided. The server rack includes a sidewall and an aperture in the sidewall. Further, the server rack includes a retractable terminal configured to extend through the aperture of the sidewall.

In another general embodiment, a server rack is provided. The server rack includes a sidewall and an aperture in the sidewall. The server rack also includes a first fixed rail within the sidewall, and a second fixed rail within the sidewall. Moreover, the server rack includes a retractable terminal configured to extend through the aperture of the sidewall.

Other aspects and embodiments of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of zero-U rack systems, as well as operation and/or component parts thereof.

In one general embodiment, a server rack is provided. The server rack includes a sidewall and an aperture in the sidewall. Further, the server rack includes a retractable terminal configured to extend through the aperture of the sidewall.

In another general embodiment, a server rack is provided. The server rack includes a sidewall and an aperture in the sidewall. The server rack also includes a first fixed rail within the sidewall, and a second fixed rail within the sidewall. Moreover, the server rack includes a retractable terminal configured to extend through the aperture of the sidewall.

FIGS. 1-6 depict a server rack 100, in accordance with various embodiments. As an option, the server rack 100 may be implemented in conjunction with features from any other embodiment listed herein, such as those described with reference to the other FIGS. Of course, however, such server rack 100 and others presented herein may be used in various applications and/or in permutations which may or may not be specifically described in the illustrative embodiments listed herein. Further, the server rack 100 presented herein may be used in any desired environment.

Figure 1:
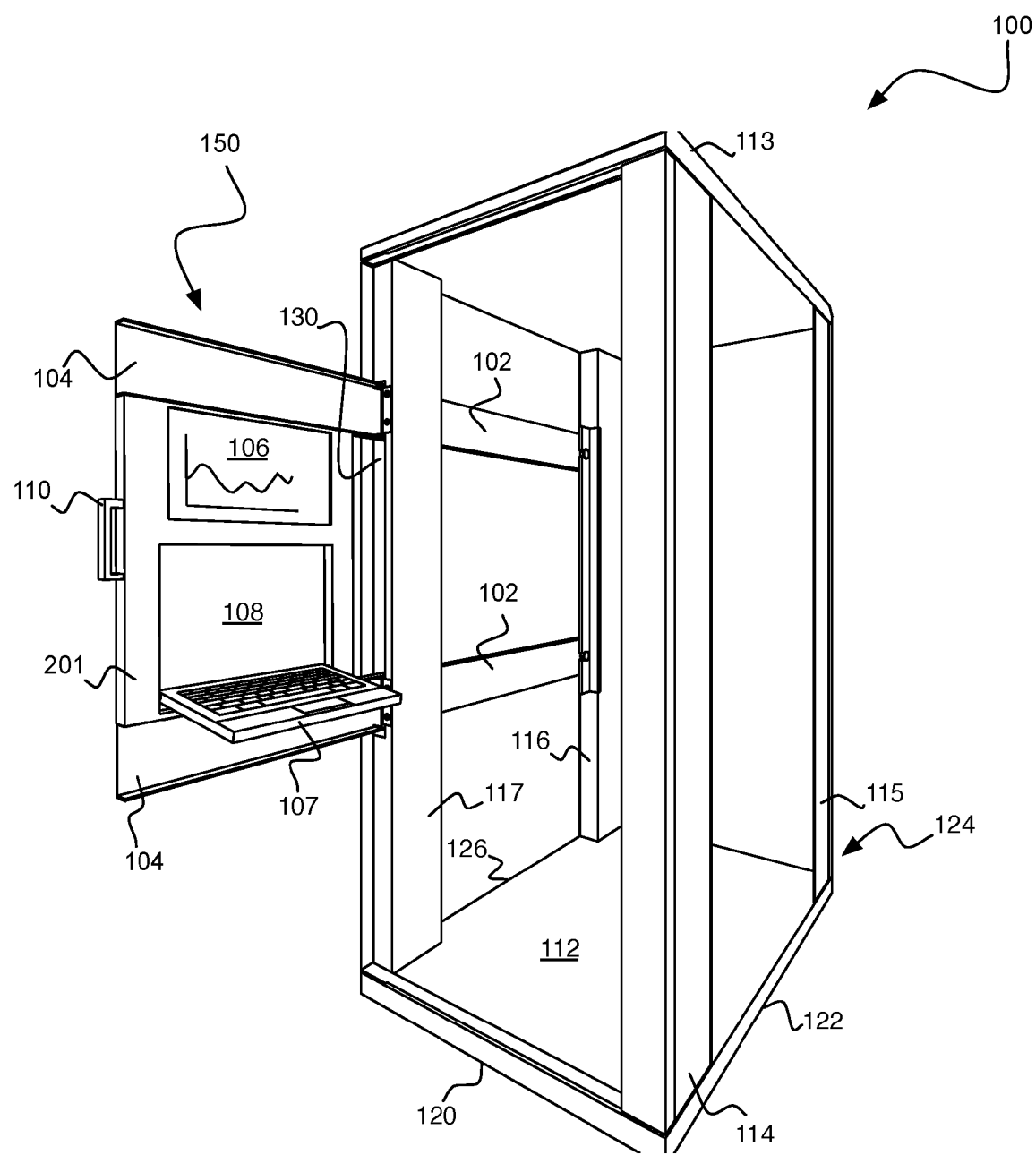
FIGS. 1-6 illustrate server racks, according to various embodiments.

As shown in FIG. 1, the server rack 100 includes a base 112, a top 113, sidewall 114, sidewall 115, sidewall 116, and sidewall 117. The server rack 100 is shown oriented to include a front face 120, a rear face 124, a right side 122, and a left side 126 (from a direction facing the server rack 100). As an option, a door (not shown) may be installed on the front face 120 of the server rack 100. Moreover, hardware components may be installed into, and removed from, the server rack 100 via access from the front face 120.

To assist with understanding the various embodiments disclosed herein, by providing sufficient view of the inside of the server rack 100, the sidewalls 114-117 are illustrated to be four discrete physical structures separating the base 112 from the top 113. However, it is understood that the sidewalls 114 and 115 may comprise a single panel, or one or more connected panels. Similarly, the sidewalls 116 and 117 may comprise a single panel, or one or more connected panels.

In the various embodiments disclosed herein, the server rack 100 may be of any suitable dimensions. As an option, the server rack 100 may meet Electronic Industries Alliance (EIA) standard server rack dimensions. For example, the server rack 100 may comprise a 19-inch wide rack enclosure. In accordance with EIA standardized server rack dimensions, rack mount rails (not shown) inside of the server rack 100 may be spaced 17.75 inches (450.85 mm) apart, with a height of 1.75 inches (44.45 mm). Each 1.75 inch unit may otherwise be referred to as a U or 1 U. Accordingly, the server rack 100 may be 21 U tall, 42 U tall, 44 U tall, 47 U tall, etc. On rack mount rails within the server rack 100, various computer and network hardware may be mounted. For example, the server rack 100 may house servers, switches, encryption hardware, network storage appliances, multiplexers, routers, power supplies, surge protectors, etc.

Still yet, the server rack 100 is shown to include an aperture 130 in the sidewall 117, and a retractable terminal 150 configured to extend and retract through the aperture 130 of the sidewall 117. The aperture 130 may comprise a vertically oriented space or void (i.e., height>width) that is proximal to and generally parallel with a sidewall of the server rack 100. As an option, the aperture 130 may comprise a vertically oriented space or void in a load-bearing structure of the server rack 100.

In various embodiments, the retractable terminal 150 may include a display 106 and input device 107. The display 106 may comprise a liquid crystal display (LCD), a light-emitting diode (LED) display, etc. Additionally, the input device 107 may include any combination of a mouse, a keyboard, a trackpad, touchpad, etc.

In one embodiment, the display 106 and the input device 107 may comprise a touchscreen device. FIG. 2B illustrates one embodiment wherein a touch screen device 220, such as, for example, a capacitive touch screen display or a tablet computer, is included in a panel 201 of the retractable terminal 150 in lieu of a display 106 and an input device 107.

Referring back to FIG. 1, the retractable terminal 150 includes sliding rails 104 and a handle 110. The sliding rails 104 may be configured to slide along fixed rails 102. In one embodiment, each pairing of a fixed rail 102 and sliding rail 104 may comprise a drawer slide assembly. As shown in FIG. 1, the fixed rails 102 may be attached to the sidewalls 116 and 117. In particular, the fixed rails 102 are shown attached at the sidewall 117 proximal to the front face 120 and at the sidewall 116 proximal to the rear face 124. In this manner, the retractable terminal 150 may provide display and input devices on a generally vertically oriented sliding drawer that does not utilize any space or rack units within the server rack 100. The retractable terminal 150 extends out of the server rack 100 and retracts into the server rack 100 through the aperture 130 along the fixed rails 102.

Although FIG. 1 and the following illustrations depict the server rack 100 as including two sets of sliding rails 104 and fixed rails 102, it is contemplated that only one set of sliding rails 104 and fixed rails 102 may provide adequate support and rigidity for reliably extending and retracting the retractable terminal 150.

Figure 2A:
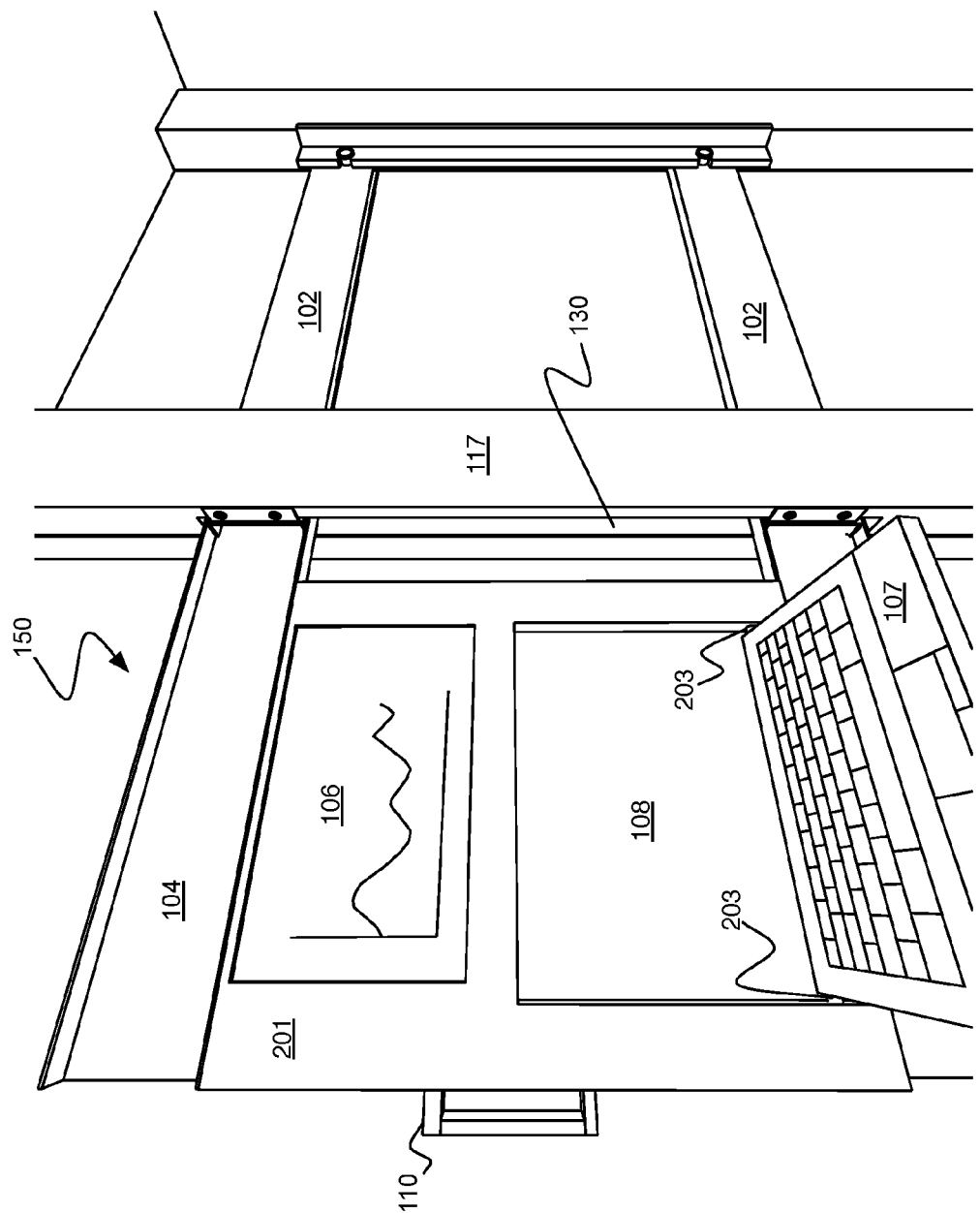
Figure 2B:
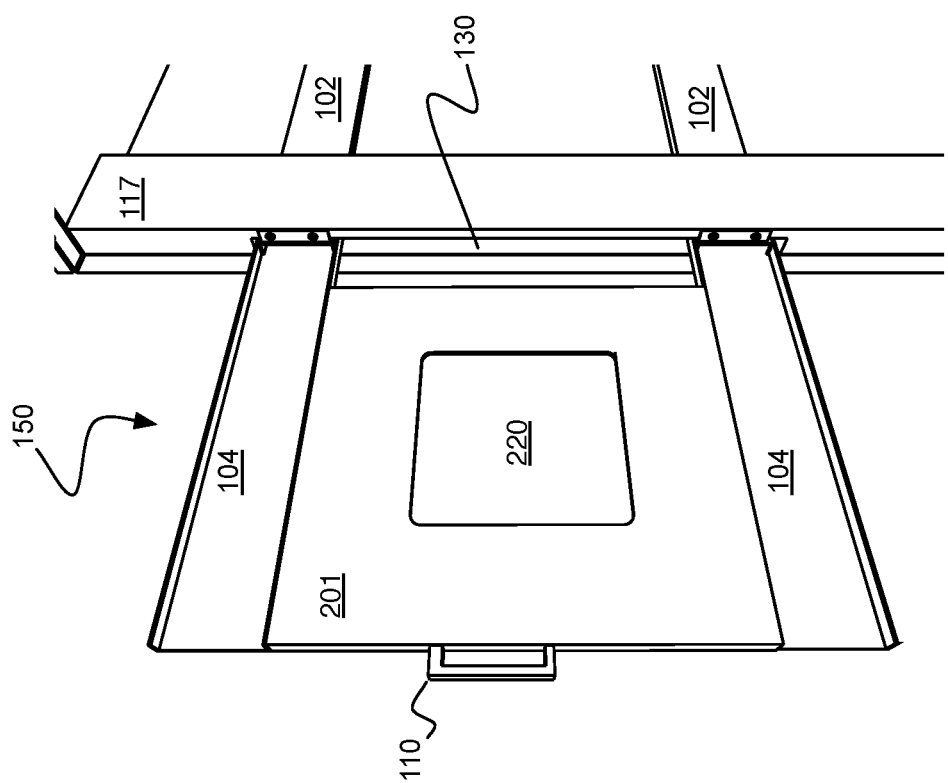

Referring now to FIG. 2A, a close-up perspective view of the retractable terminal 150 is shown. As illustrated by FIG. 2A, the display 106 and input device 107 are mounted to a panel 201. Further, the panel 201 is secured to the sliding rails 104 such that the display 106 and the input device 107 travel with the panel 201 as it is extended out of and retracted into, the server rack 100 through aperture 130.

Moreover, the panel 201 is shown to include a recess 108. The recess 108 may include any void or indentation in the panel 201 that encloses the input device 107 when the input device 107 is not being used. The input device 107 may be pivotally mounted. For example, as shown in FIG. 2A, the input device 107 is pivotally mounted via hinges 203 in a manner that allows the input device 107 to be folded out for use in a generally horizontal orientation (as shown in FIG. 2A) when the retractable terminal 150 is extended out of the sidewall 117 for operation by a user.

In some embodiments, computing hardware may be included in the panel 201 of the retractable terminal 150. For example, included within the panel 201 may be a hardware processor and logic integrated with and/or executable by the processor. The logic may include software. For example, the software may be stored on a hard disk drive, solid state drive, memory, etc. that is installed within the panel 201. In such embodiments, the computing hardware in the panel 201 may be configured to receive input from the display 106, the input device 107, and/or the touch screen device 220, and to output display data and other data to the display 106, the input device 107, and/or the touch screen device 220.

In other embodiments, the display 106, the input device 107, and/or touch screen device 220 may send/receive I/O from computing hardware installed within the server rack 100. For example, the display 106, the input device 107, and/or touch screen device 220 may be interfaced to control a rack-mounted server or workstation within the server rack 100.

Figure 3:
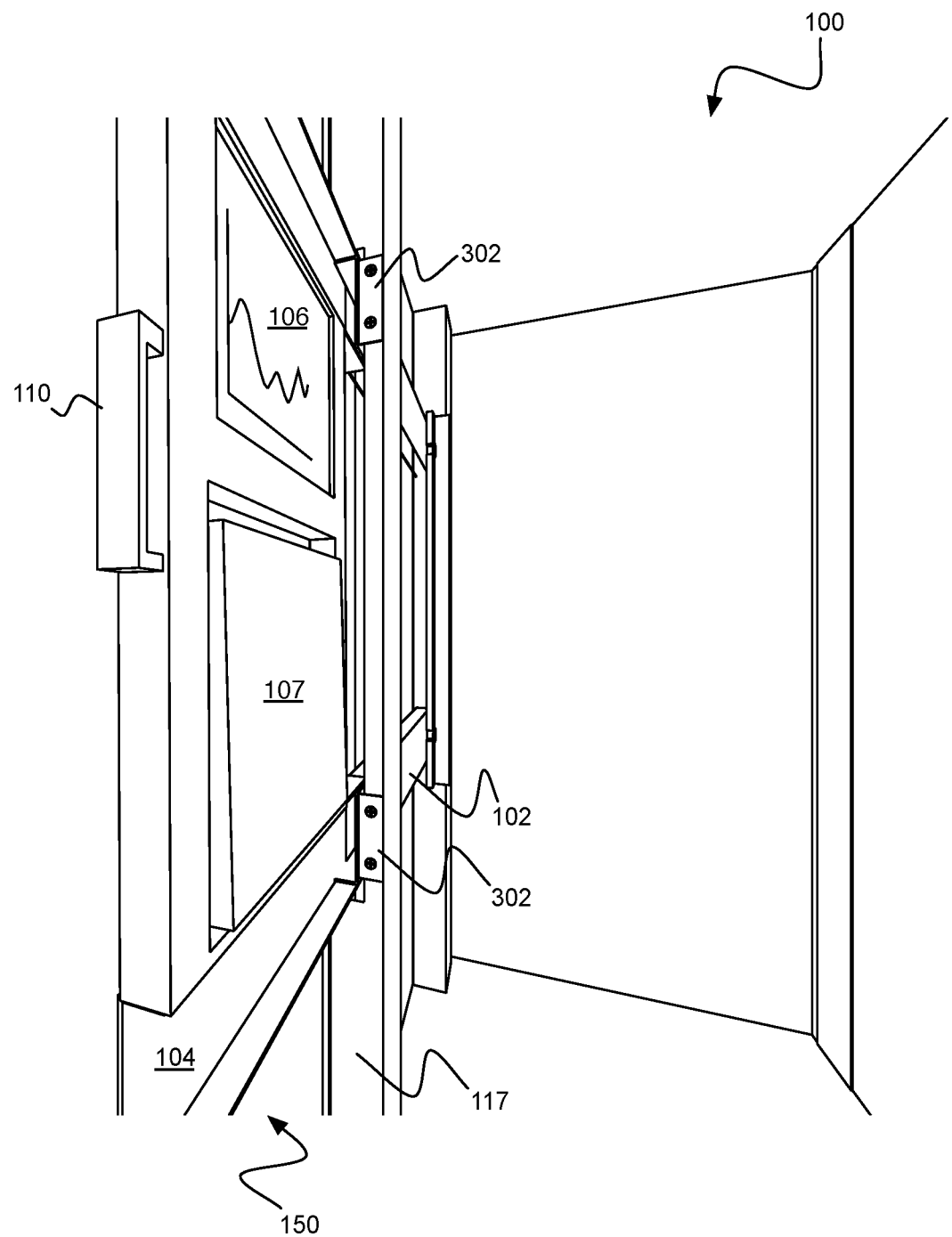
Figure 4:
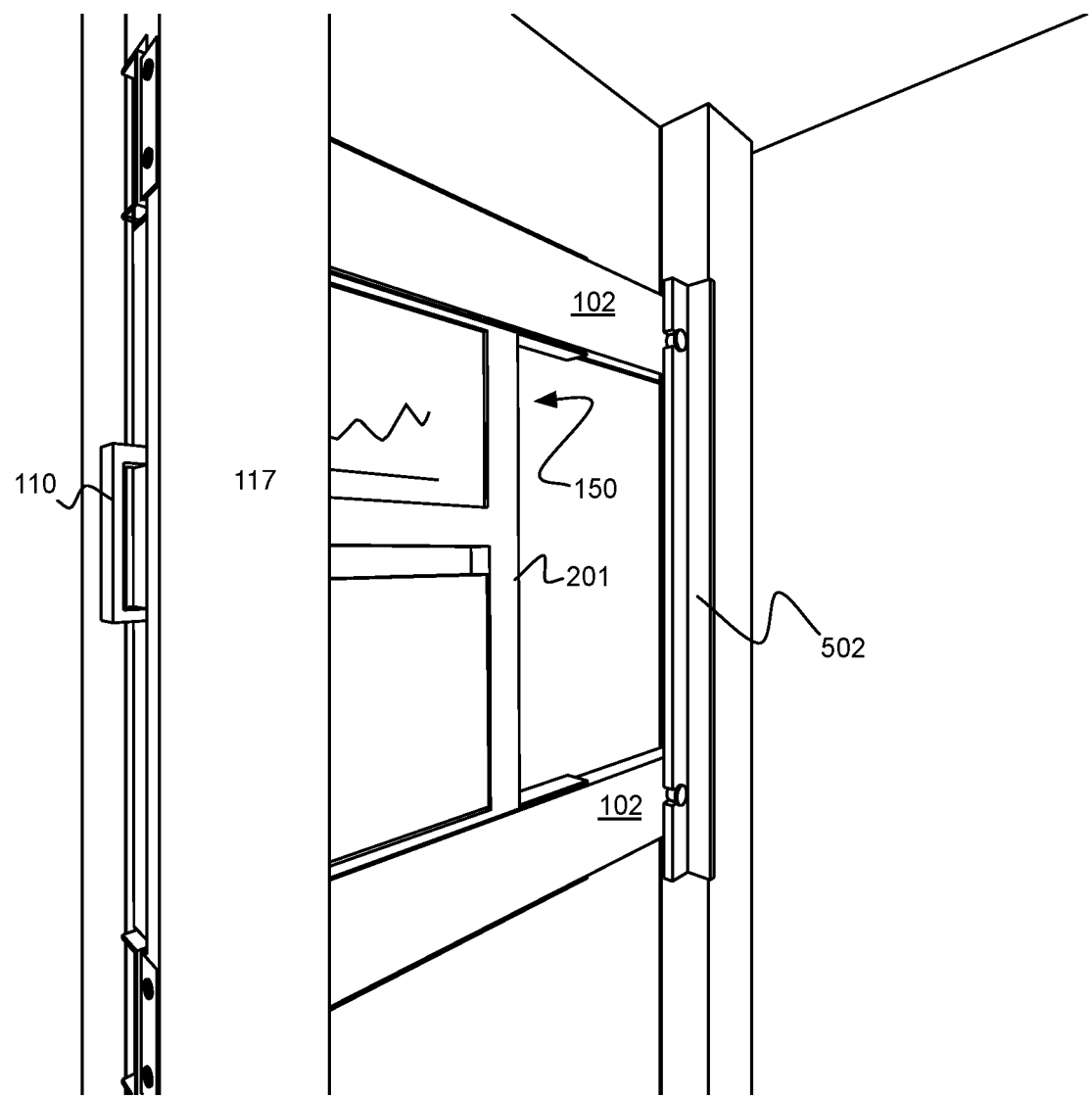

Still yet, referring now to FIGS. 3 and 4, pivotally mounting the input device 107 allows the input device 107 to be folded away into a generally vertical orientation when the retractable terminal 150 is unused or being stowed within the sidewall 117. For example, in FIG. 3, the input device 107 has been folded up. In this orientation, the input device 107 is not exposed to receive erroneous or unintentional user input. A user viewing the display 106 but not providing input via the input device 107 may leave the input device 107 folded up and inaccessible. Moreover, with the input device 107 in this orientation, the retractable terminal 150 may be retracted within the sidewall 117 without physical impediment due to the input device 107.

For example, referring now to FIG. 4, the retractable terminal 150 has been retracted within the sidewall 117. When the retractable terminal 150 is retracted within the sidewall 117, an exterior door (not shown) of the server rack 100 may be closed and/or locked to prevent unauthorized access to the contents of the server rack 100. Also, closing the exterior door of the server rack 100 may improve airflow within the server rack 100, thereby cooling the electronic components within. Accordingly, the retractable terminal 150 may remain in a generally vertical orientation both when in use and when being stored within the sidewalls 116 and 117 of the server rack 100.

As illustrated by FIG. 4, the handle 110 may remain externally accessible to a user when the retractable terminal 150 is within the sidewall 117. In other words, when the retractable terminal 150 is within the sidewall 117, the handle 110 may remain accessible to a user that is outside of the server rack 100. For example, the user may be standing facing the front face 120 of the server rack 100. When the user pulls on the handle 110, the retractable terminal 150 may extend out of the aperture 130 of the server rack 100 by gliding along a path provided by the fixed rails 102. The handle 110 may comprise any fixture of the retractable terminal 150 that is accessible from outside of the server rack 100 when the retractable terminal 150 has been retracted within the server rack 100, and capable of withstanding the push/pull forces of a user retracting/extending the retractable terminal 150.

With the retractable terminal 150 housed entirely within or along a sidewall of the server rack 100, air may flow unimpeded throughout the server rack 100, thereby ensuring that the electronic components within the server rack 100 are adequately cooled.

Figure 5:
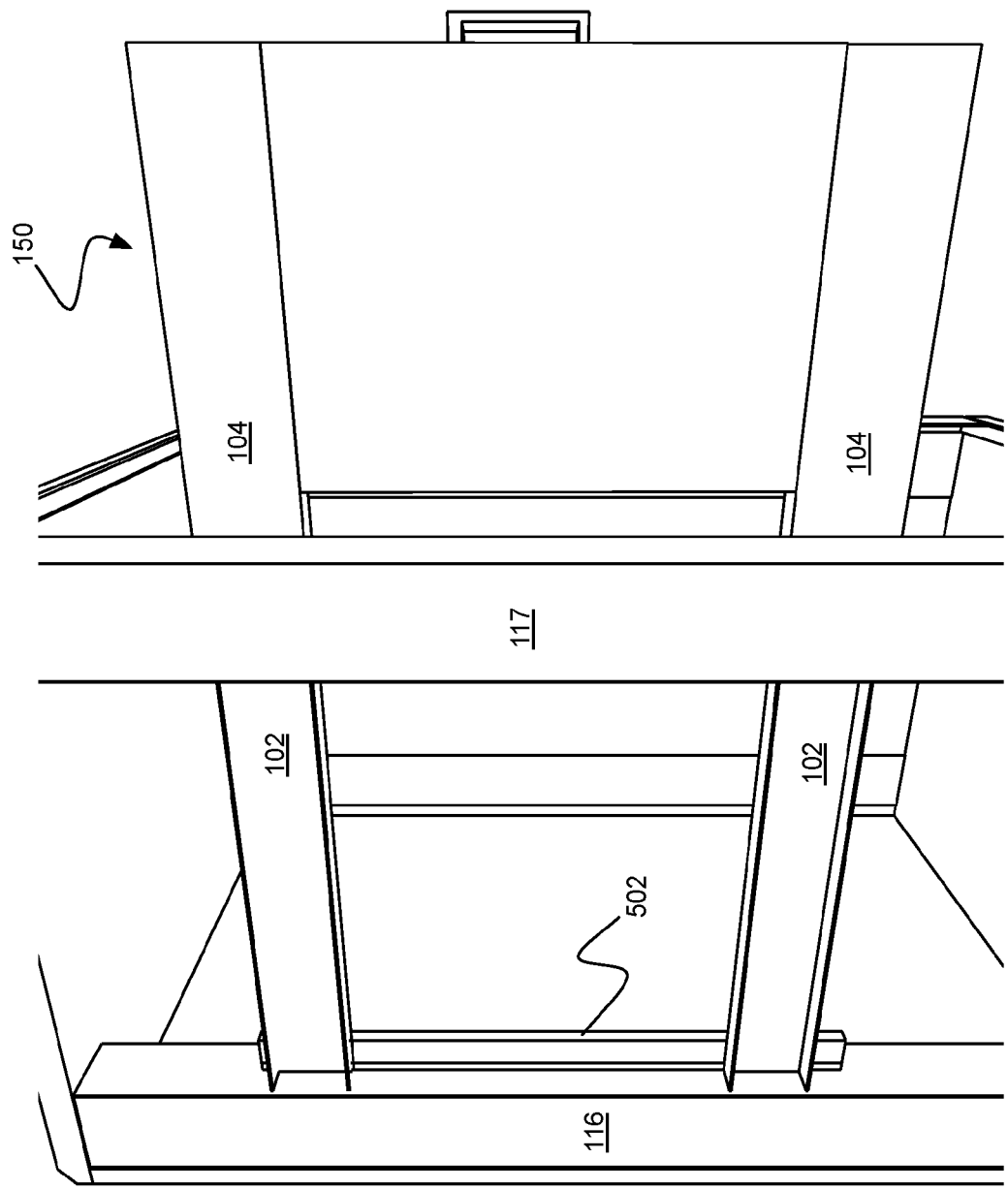
Figure 6:
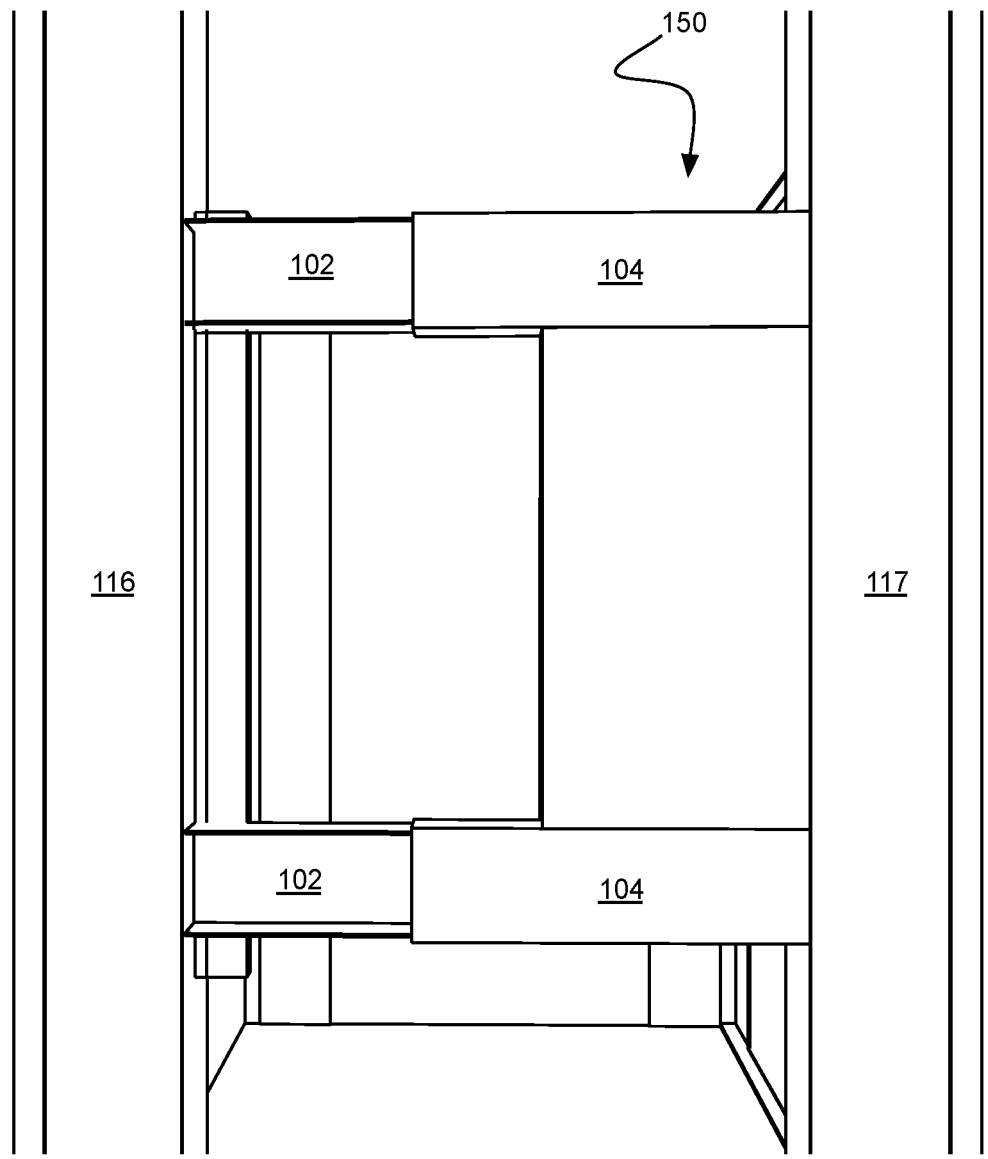

FIGS. 5 and 6 illustrate perspective views of the left side 126 of the server rack 100 with the retractable terminal 150 extended (FIG. 5) and with the retractable terminal 150 retracted (FIG. 6). Visible in FIG. 5 is a rear bracket 502, which is discussed in more detail in the context of FIGS. 8A-8B.

Figure 7:
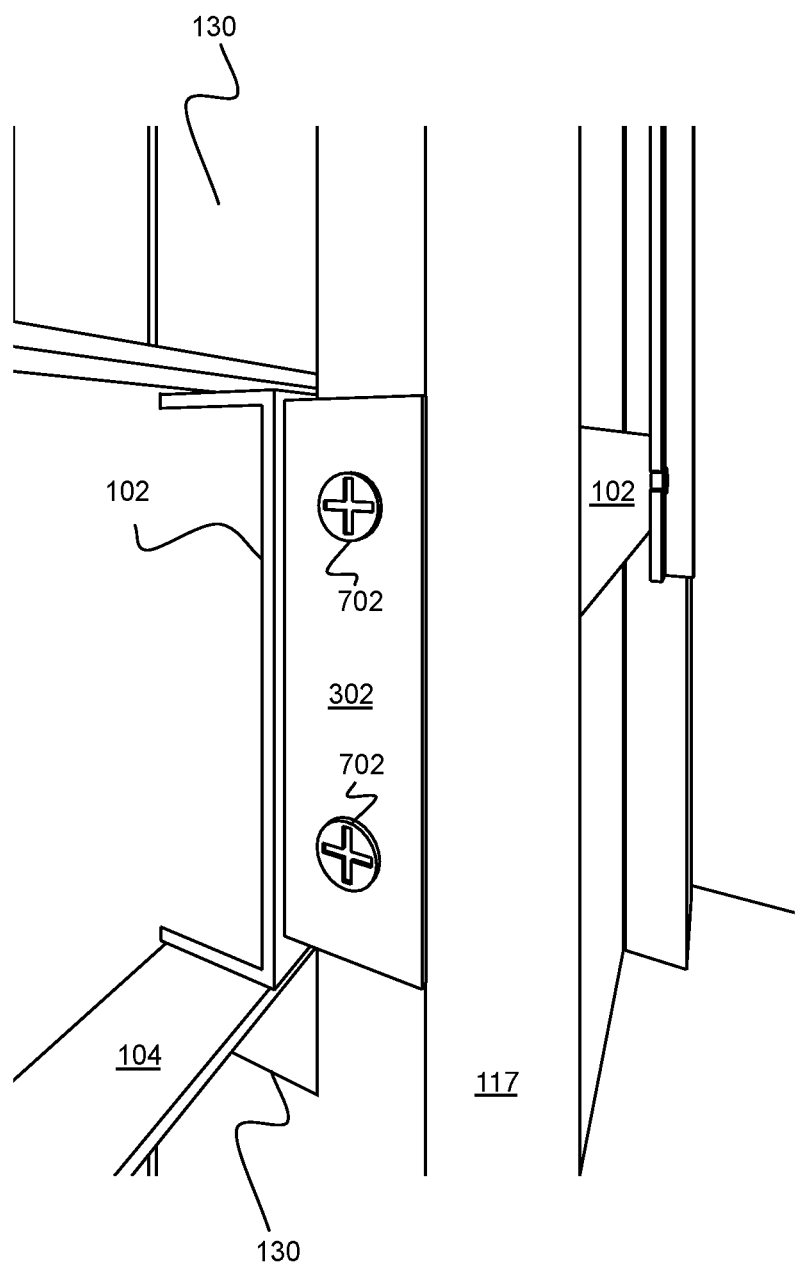
FIG. 7 illustrates a stopper plate, according to one embodiment.

FIG. 7 depicts a stopper plate 302 of a fixed rail 102, in accordance with one embodiment. As an option, the present stopper plate 302 may be implemented in conjunction with features from any other embodiment listed herein, such as those described with reference to the other FIGS. Of course, however, such stopper plate 302 and others presented herein may be used in various applications and/or in permutations which may or may not be specifically described in the illustrative embodiments listed herein. Further, the stopper plate 302 presented herein may be used in any desired environment.

In some embodiments, a stopper plate 302 may be attached to a fixed rail 102 for convenient mounting of the fixed rail 102 to the sidewall 117. Where the server rack 100 includes multiple fixed rails 102, each fixed rail 102 may be attached to a stopper plate 302. Further, each of the stopper plates 302 may be mounted to the same sidewall.

As shown in FIG. 7, the stopper plate 302 comprises a plate that is formed at or attached to an end of the fixed rail 102. The stopper plate 302 is shown to extend from the fixed rail 102 in a direction that is generally orthogonal to the direction of travel of the retractable terminal 150 along the fixed rail 102. As an option, this orientation may ensure that the stopper plate 302 is parallel with and adjacent to an edge of the sidewall 117 that is parallel with the front face 120 of the server rack 100. In one embodiment, the stopper plate 302 and the fixed rail 102 may be formed or manufactured in a unitary manner, such that they are components of a single contiguous piece of metal or plastic. In another embodiment, the stopper plate 302 may be attached to the fixed rail 102 using fasteners. For example, the stopper plate 302 may be attached to the fixed rail 102 using one or more of bolts, screws, rivets, adhesives, welds, etc.

The stopper plate 302 may be used to secure or attach the fixed rail 102 to the sidewall 117. In one embodiment, the fixed rail 102, with the stopper plate 302 attached, may be inserted into the server rack 100 during assembly. In particular, the fixed rail 102 may be inserted into the aperture 130 and slid directly back, in a direction parallel with the sidewalls 116 and 117, towards the rear face 124. After the fixed rail 102 contacts a rear of the aperture 130, and/or the stopper plate 302 contacts a front face of the sidewall 117, fasteners 702 may be used to secure the stopper plate 302 to the sidewall 117. After the fasteners 702 have secured the fixed rail 102, the fasteners 702 may prevent any further movement of the fixed rail 102 with respect to the server rack 100. In some embodiments, the fixed rails 102 may be installed to only a fraction (e.g., ⅓, ½, ¾, etc.) of the depth of the server rack 100. In other words, when retracted within the server rack 100, the retractable terminal 150 may occupy only a portion of the total depth of the server rack 100.

Figure 8A:
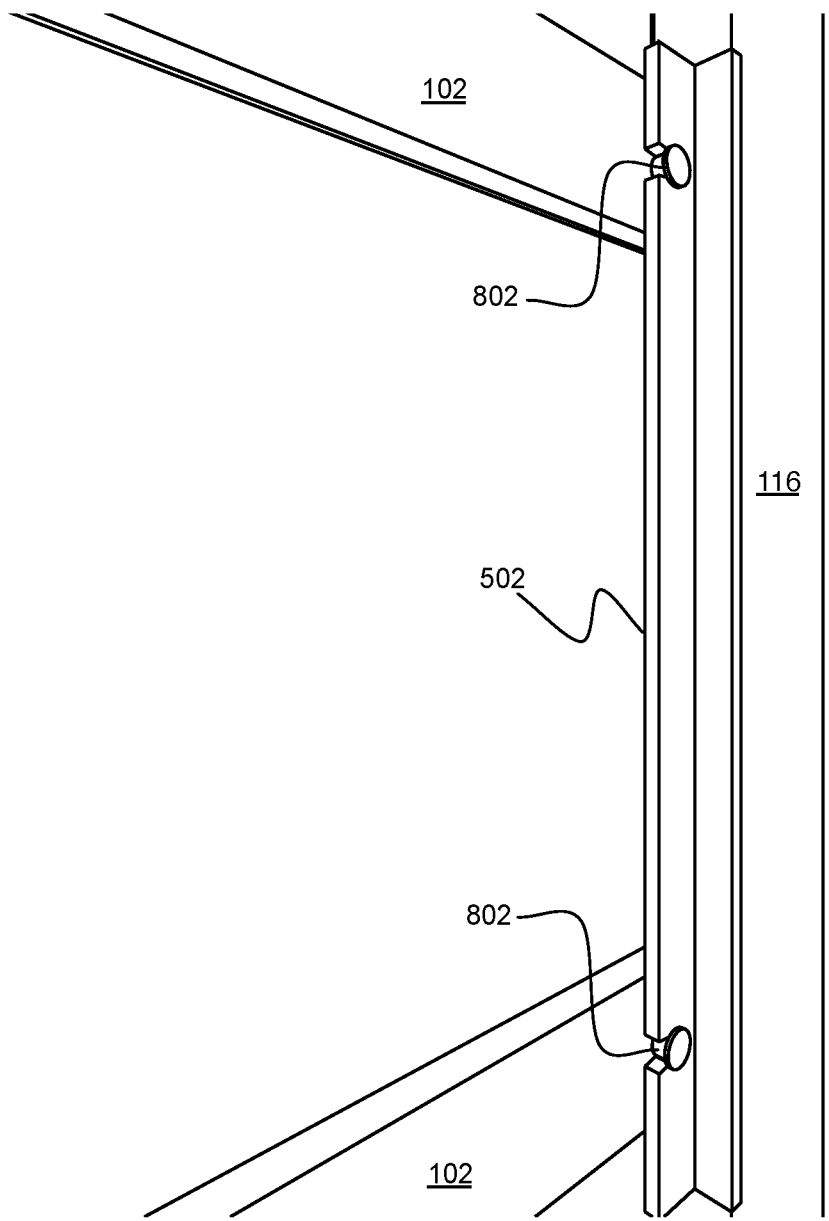
FIGS. 8A-8B illustrate an attachment mechanism, according to one embodiment.
Figure 8B:
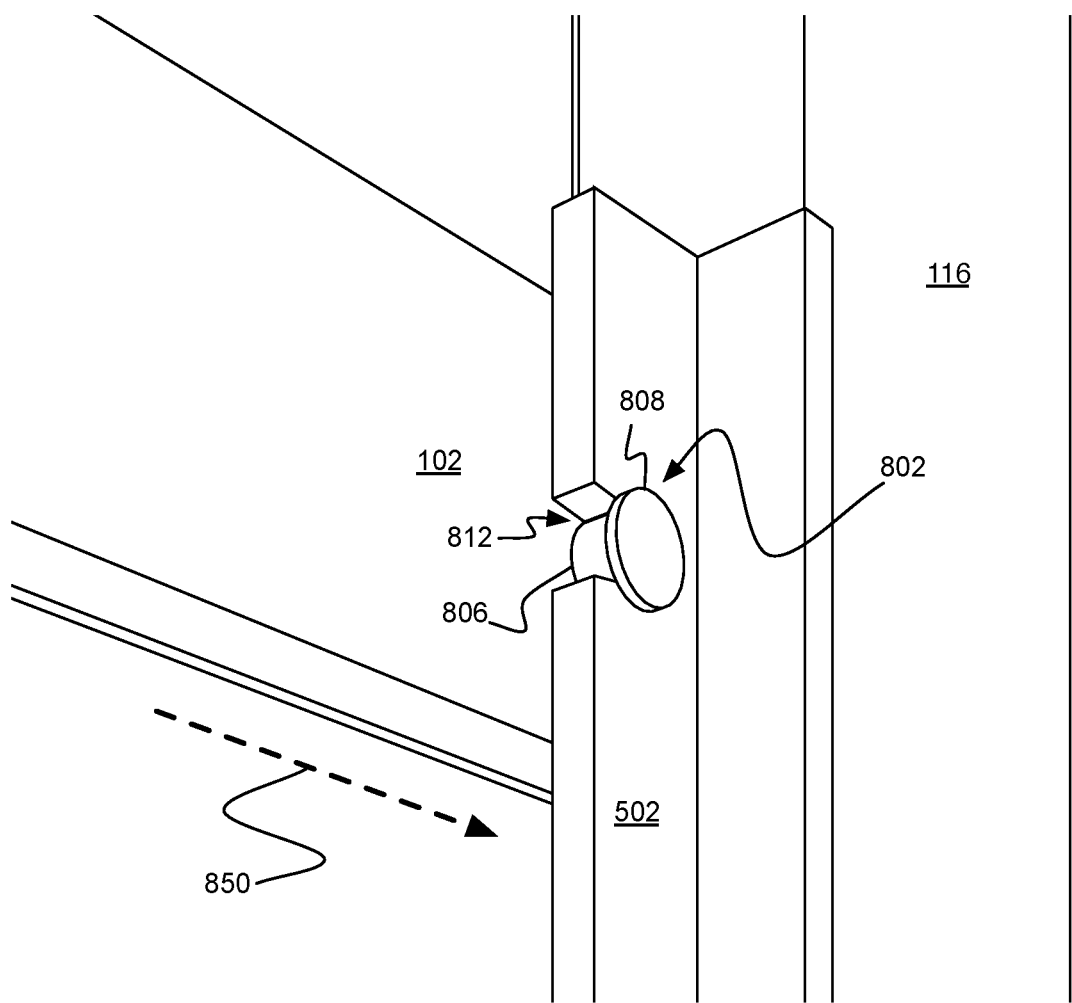

FIGS. 8A-8B depict an attachment mechanism for the fixed rails 102, in accordance with one embodiment. As an option, the attachment mechanism may be implemented in conjunction with features from any other embodiment listed herein, such as those described with reference to the other FIGS. Of course, however, such attachment mechanism and others presented herein may be used in various applications and/or in permutations which may or may not be specifically described in the illustrative embodiments listed herein. Further, the attachment mechanism presented herein may be used in any desired environment.

Referring now to FIG. 8A, a rear bracket 502 is shown attached to the sidewall 116. Further, the rear bracket 502 is shown to comprise an L-shaped bracket that is attached to the sidewall 116. Although FIGS. 8A and 8B illustrate the rear bracket 502 as being an elongated L-shaped bracket, it is understood that the rear bracket 502 may be embodied in any conformation suitable for fixably mounting the fixed rail 102 to the sidewall 116.

In one embodiment, the rear bracket 502 and the sidewall 116 may be formed or manufactured in a unitary manner, such that they are components of a single contiguous piece of metal or plastic. In another embodiment, the rear bracket 502 may be attached to the sidewall 116 using fasteners. For example, the rear bracket 502 may be attached to the sidewall 116 using one or more of bolts, screws, rivets, adhesives, welds, etc.

Each of the fixed rails 102 is shown to include a mushroom pin 802. In one embodiment, the mushroom pin 802 and the fixed rail 102 may be formed or manufactured in a unitary manner, such that they are components of a single contiguous piece of metal or plastic. In another embodiment, the mushroom pin 802 may be attached to the fixed rail 102 using fasteners. For example, the mushroom pin 802 may be threaded into, bolted to, riveted to, welded to, adhered to, etc. the fixed rail 102.

As illustrated by FIG. 8B, the mushroom pin 802 includes a post 806 that extends from the fixed rail 102, with a flange 808 on the distal end of the post 806. In one embodiment, the post 806 may be generally cylindrical with a first diameter, and the flange 808 may be generally cylindrical with a second diameter that is greater than the first diameter of the post 806. In other embodiments, the post 806 and/or the flange 808 may have other geometric profiles (e.g., square, pentagonal, octagonal, etc.).

The mushroom pin 802 may interface with the rear bracket 502 such that the fixed rail 102 is fixably mounted to the sidewall 116. In particular, a notch 812 of the rear bracket 502 may receive the post 806 of the mushroom pin 802 as the fixed rail 102 is inserted along the insertion direction 850. The diameter of the post 806 of the mushroom pin 802 may be substantially identical to, or less than, a diameter of a notch 812 in the rear bracket 502. Further, the diameter of the flange 808 of the mushroom pin 802 may be greater than the diameter of the notch 812 in the rear bracket 502.

Thus, when the fixed rail 102 has been inserted along the insertion direction 850 such that the mushroom pin 802 is seated in the notch 812, all movement of the fixed rail 102 in any direction other than one directly opposite of the insertion direction 850 may be prohibited. Moreover, if the fixed rail 102 is anchored to prevent any movement opposite to the insertion direction 850, e.g., using a stopper plate 302 and fasteners 702, then the fixed rail 102 may be securely attached to the sidewalls 116 and 117 in a manner that precludes any and all movement of the fixed rail 102 relative to the server rack 100.

Utilizing the mushroom pin and notch system of FIGS. 8A-8B in conjunction with the stopper plate system described in the context of FIG. 7 may provide a slider system that is user-serviceable without requiring specialized tooling or direct access to the side (i.e., the left side 126) of the server rack 100. In other words, a user at the front face 120 of the server rack 100 may securely install the fixed rails 102 without requiring access to the rear or sides of the server rack 100. After installing the fixed rails 102 within the server rack 100, the sliding rails 104 and retractable terminal 150 may be slideably installed onto the fixed rails 102. Accordingly, in a commercial server environment, where the rear and sides of the server rack 100 are generally inaccessible due to the tight side-by-side packing of multiple server racks 100, the mushroom pin and notch system of FIGS. 8A-8B, in conjunction with the stopper plate system of FIG. 7, may ensure that the sliding rail mechanism of the server rack 100 can be installed, repaired, or replaced with relative ease.

Of course, it is contemplated that in some embodiments, the fixed rails 102 may be more permanently affixed within the sidewalls 116 and 117. In one embodiment, the fixed rails 102 may be affixed directly to the server rack 100 without using a rear bracket 502. For example, the fixed rails 102 may be bolted, riveted, or welded to the server rack 100. In some embodiments other, attachment mechanisms may be used for attaching the fixed rails 102 to the server rack 100. For example, tabs, slots, pins, hooks, etc. may be used for attaching the fixed rails 102 to the server rack 100.

Figure 9A:
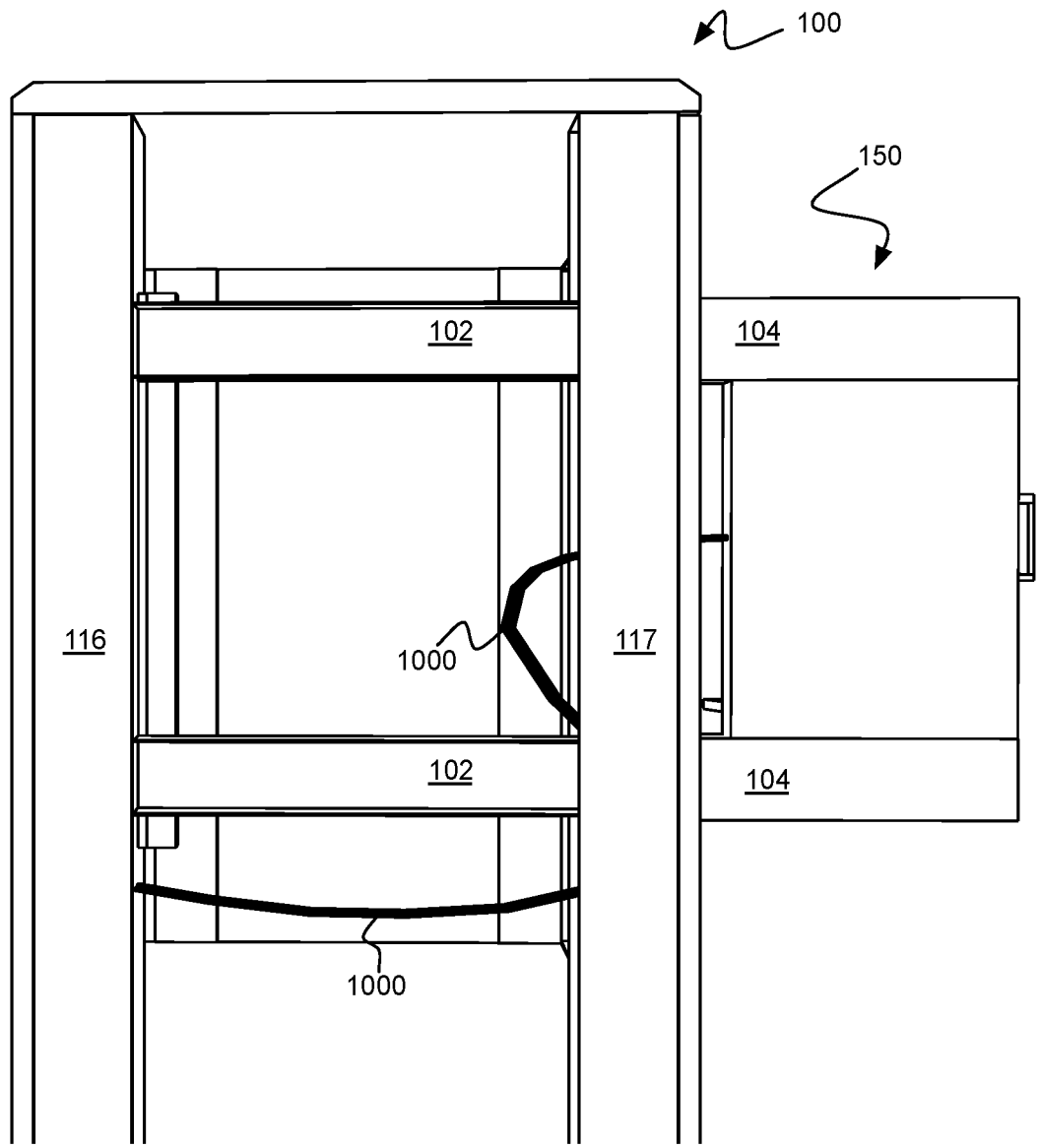
FIGS. 9A-9C illustrate cable loop routing, according to one embodiment.
Figure 9B:
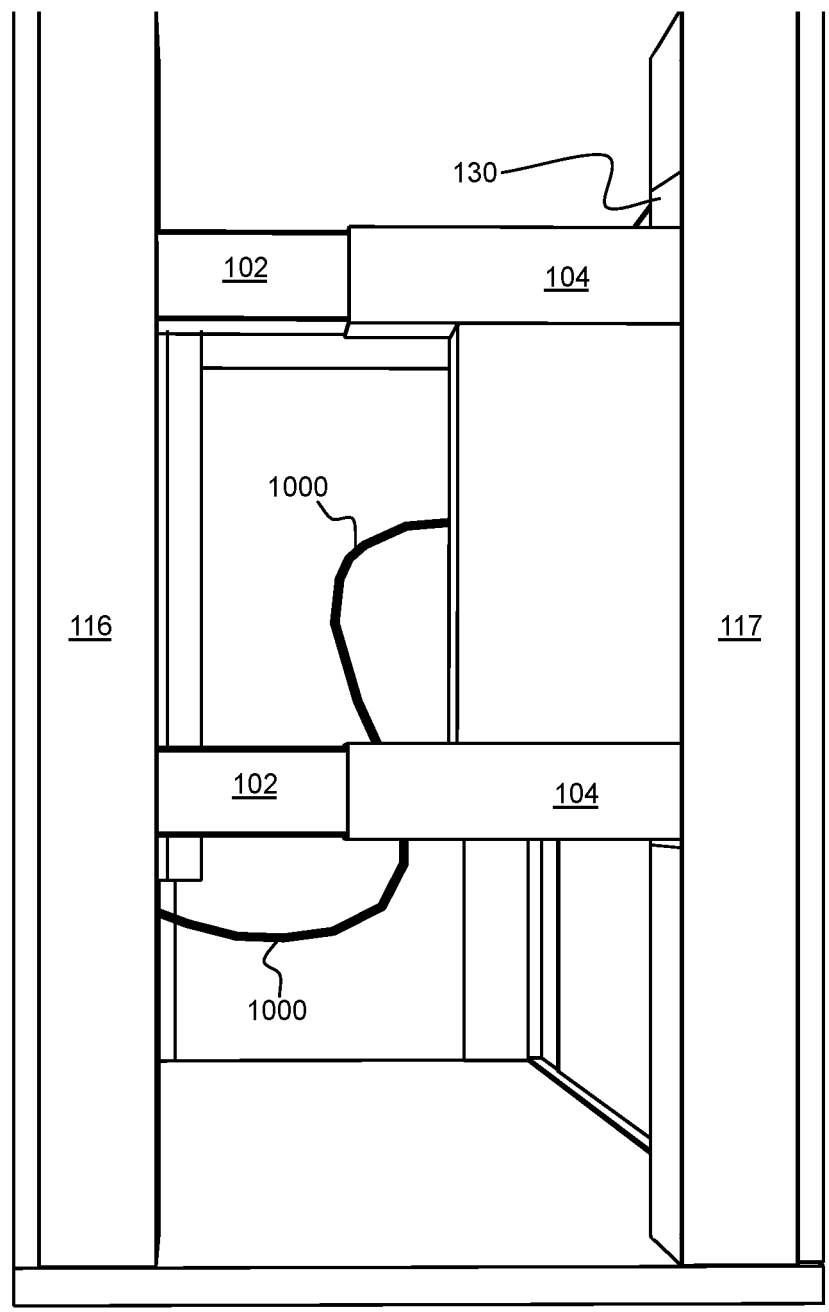
Figure 9C:
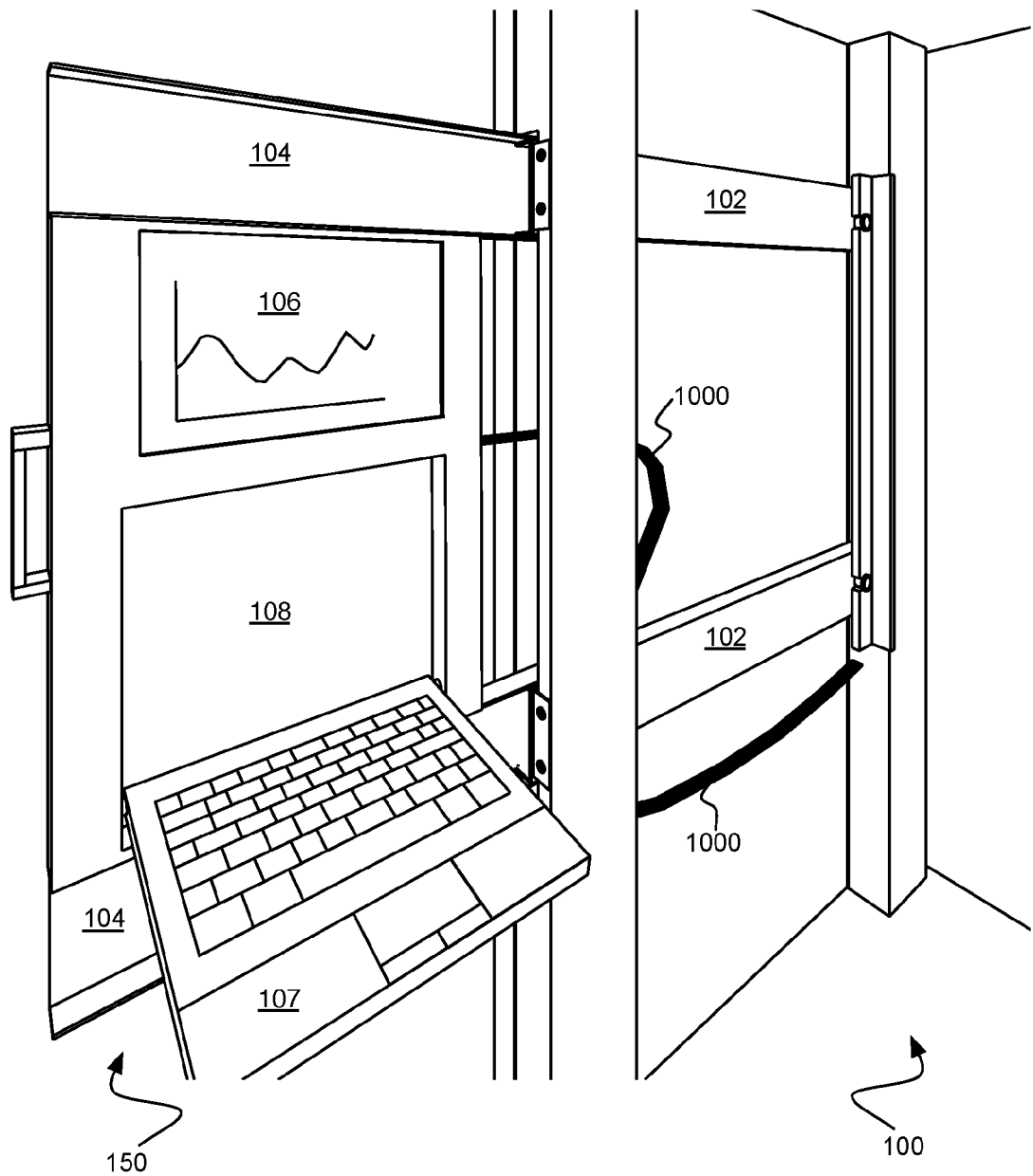

FIGS. 9A-9C depict a routing of a cable loop 1000, in accordance with one embodiment. As an option, the routing of the cable loop 1000 may be implemented in conjunction with features from any other embodiment listed herein, such as those described with reference to the other FIGS. Of course, however, such routing of the cable loop 1000 and others presented herein may be used in various applications and/or in permutations which may or may not be specifically described in the illustrative embodiments listed herein. Further, the cable loop 1000 presented herein may be used in any desired environment.

FIGS. 9A and 9B illustrate perspective views of the left side 126 of the server rack 100 with the retractable terminal 150 extended (FIG. 9A) and with the retractable terminal 150 retracted (FIG. 9B). In both of FIGS. 9A and 9B, a cable loop 1000 extends from the retractable terminal 150 at a location approximately midway between the sliding rails 104 of the retractable terminal 150. FIG. 9C illustrates a perspective view from the front of the server rack 100, with the retractable terminal 150 extended. In FIG. 9C, the cable loop 1000 extends from the retractable terminal 150 at a location approximately midway between the sliding rails 104 of the retractable terminal 150. As an option, the cable loop 1000 may be anchored towards the rear of the server rack 100. Further, the cable loop 1000 may be anchored at a point lower than where the cable loop 1000 exits the retractable terminal 150. As illustrated by FIGS. 9A-9C, the cable loop 1000 is able to move freely as the retractable terminal 150 slides along the fixed rails 102 for extending out of and retracting into the server rack 100.

In various embodiments, the cable loop 1000 may include one or more of power, data, and video cables. For example, the cable loop 1000 may include a video cable that provides a video signal to the display device 106. As another example, the cable loop 1000 may include a USB cable for transmitting input/output signals (e.g., trackpad input, key-presses, etc.) from/to the input device 107. Still yet, the cable loop 1000 may include a network cable for providing network connectivity to computing hardware of the retractable terminal 150.

Figure 10A:
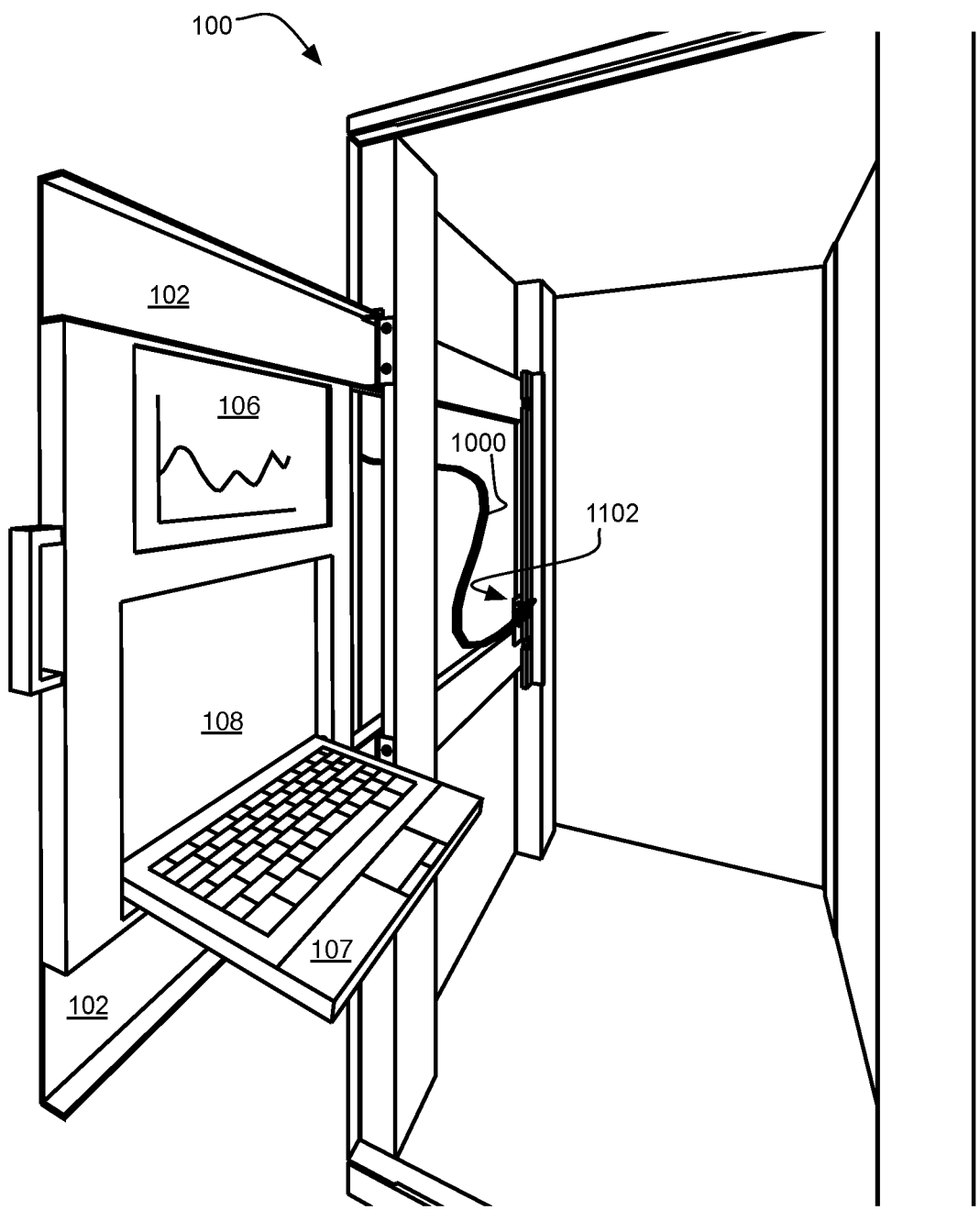
FIGS. 10A-10D illustrate cable loop routing, according to another embodiment.
Figure 10B:
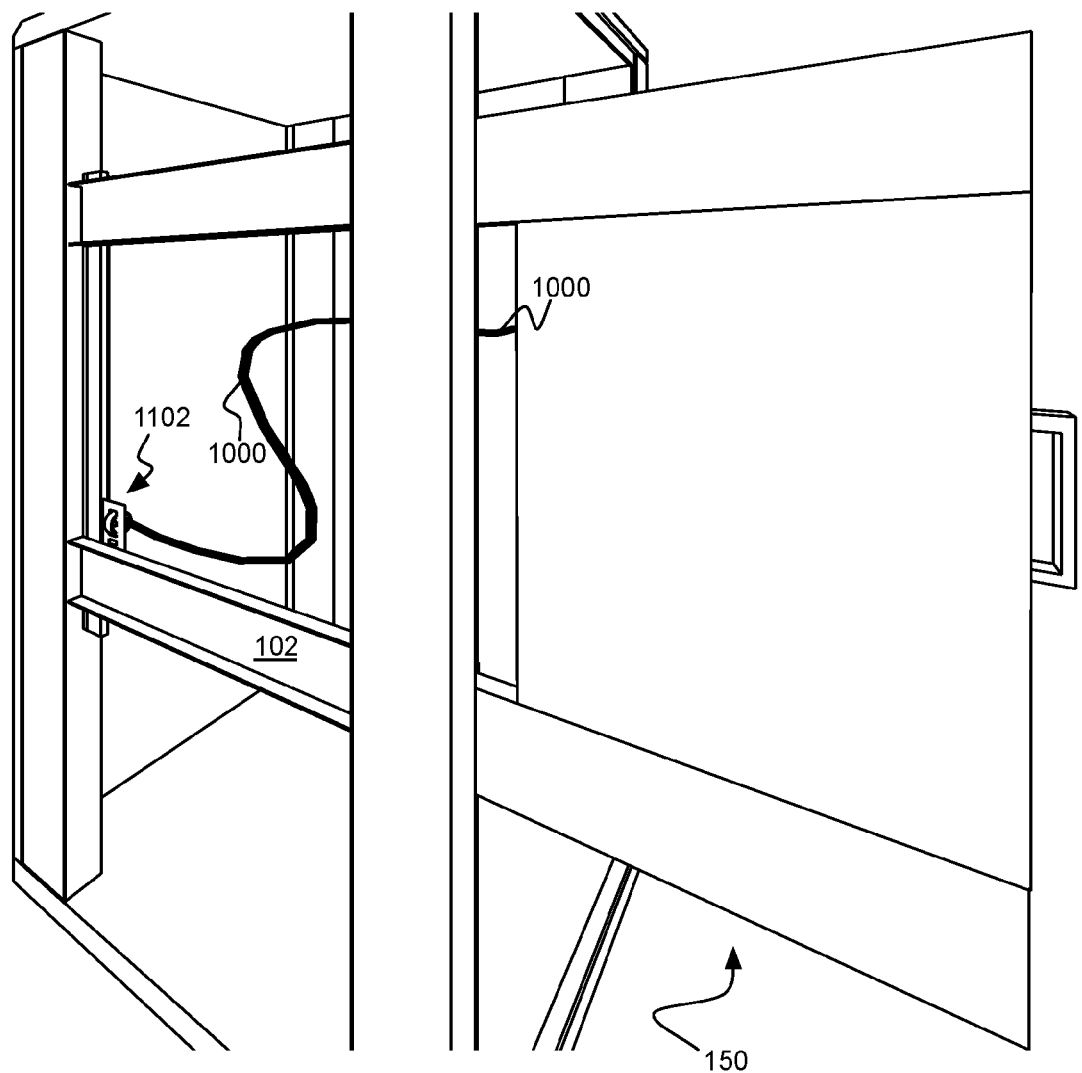
Figure 10C:
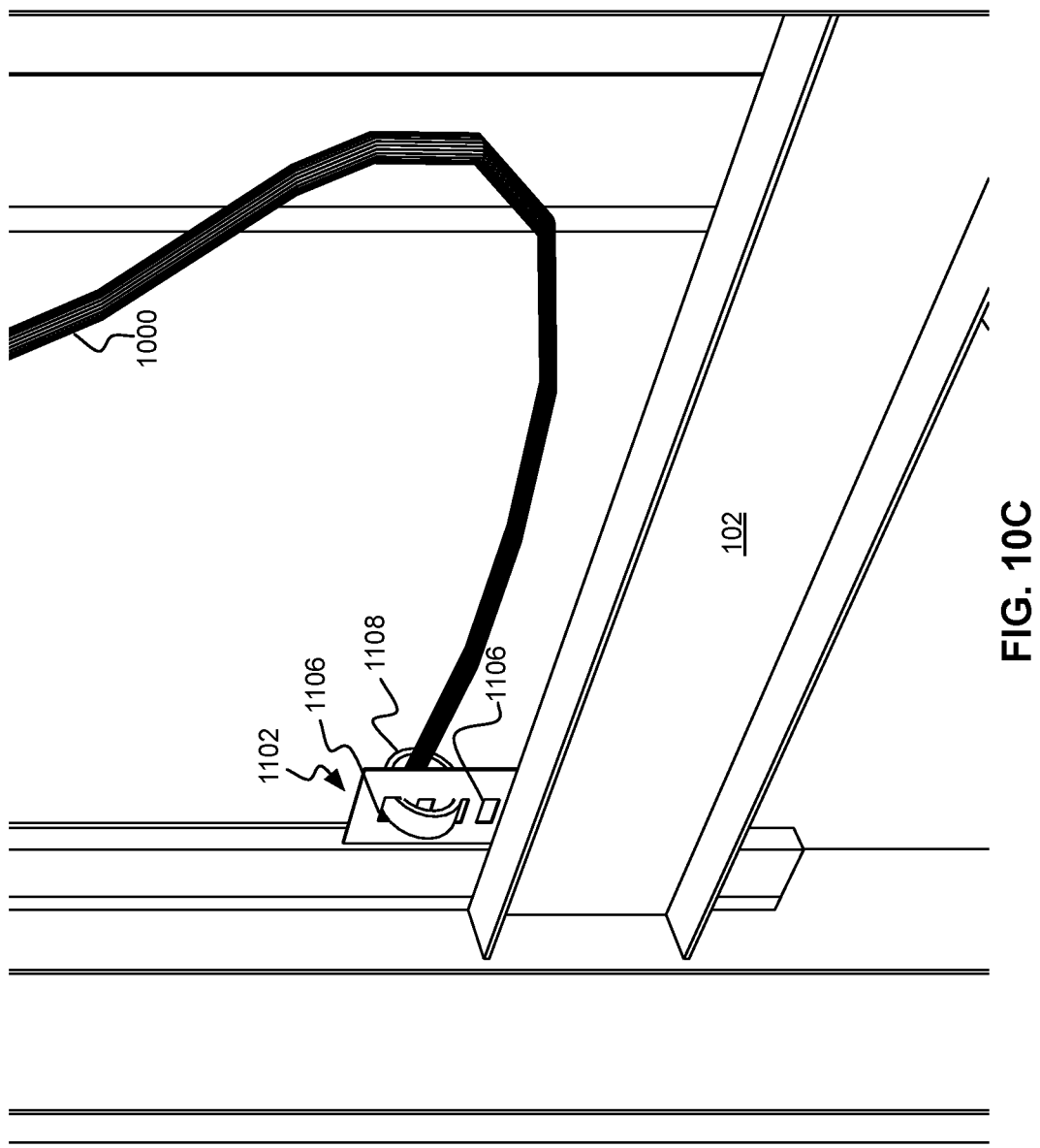

FIGS. 10A-10C depict another routing of a cable loop 1000, in accordance with one embodiment. As an option, the routing of the cable loop 1000 may be implemented in conjunction with features from any other embodiment listed herein, such as those described with reference to the other FIGS. Of course, however, such routing of the cable loop 1000 and others presented herein may be used in various applications and/or in permutations which may or may not be specifically described in the illustrative embodiments listed herein. Further, the cable loop 1000 presented herein may be used in any desired environment.

FIG. 10A illustrates a perspective view of the server rack 100 from a location in front of the front face 120 of server rack 100. FIG. 10B illustrates a perspective view of the left side 126 of the server rack 100 with the retractable terminal 150 extended. As illustrated in both FIGS. 10A and 10B, the cable loop 1000 extends from the retractable terminal 150 at a location that is closer to an upper sliding rail 104 of the retractable terminal 150 than a lower sliding rail 104 of the retractable terminal 150.

Figure 10D:
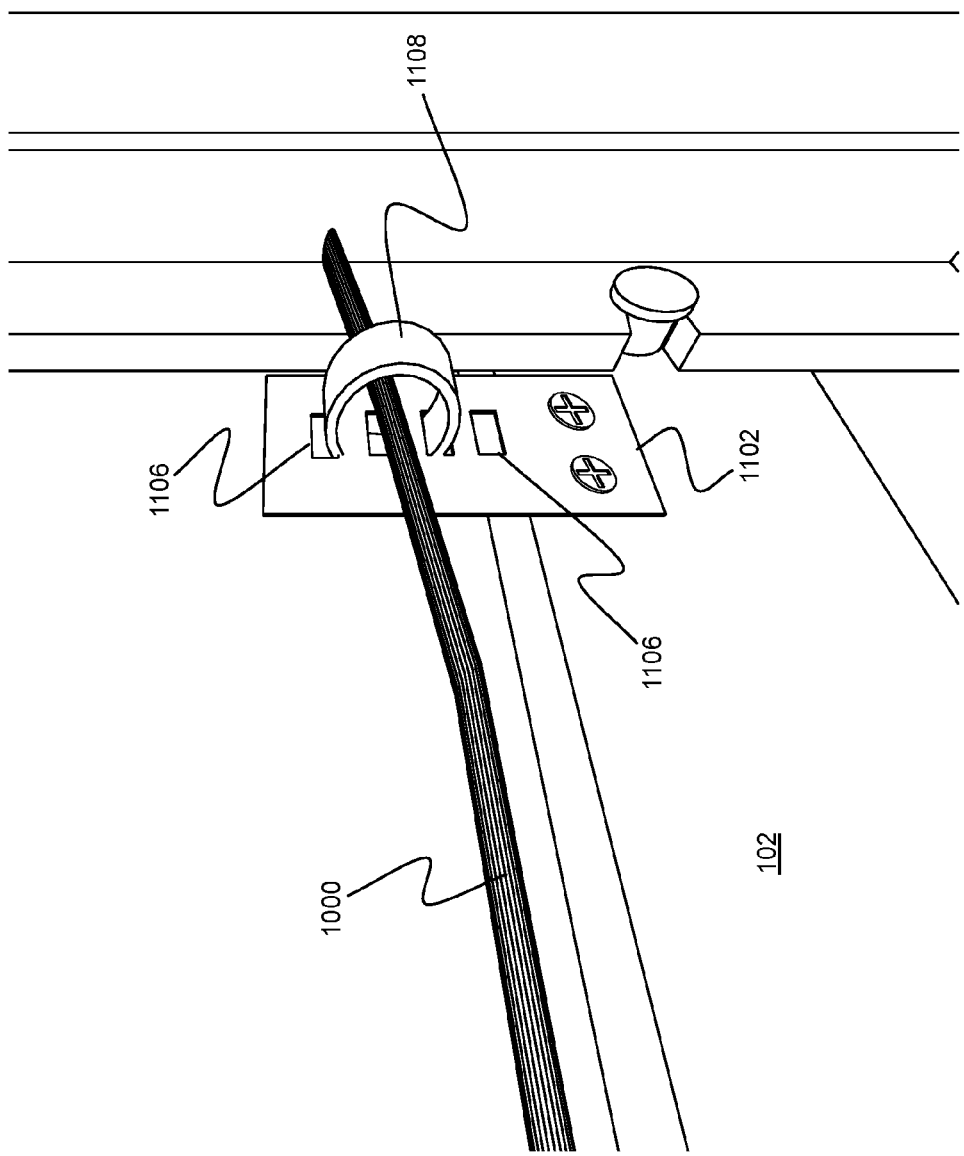

Moreover, the cable loop 1000 is anchored to a cable bracket 1102. The cable bracket 1102 may be secured to the fixed rail 102 using screws or bolts, as shown in FIGS. 10C-10D. Of course, the cable bracket 1102 may be secured to the fixed rail 102 in any feasible manner. For example, the cable bracket 1102 may be secured to the fixed rail 102 using rivets, adhesives, welds, etc. In some embodiments, the cable bracket 1102 and the fixed rail 102 may be formed or manufactured in a unitary manner, such that they are components of a single contiguous piece of metal or plastic.

The cable bracket 1102 is shown to include a plurality of slots 1106. A cable fastener 1108 may be laced through the slots 1106 and around the cable loop 1000 for physical securing the cable loop 1000. The cable fastener 1108 may comprise any fastener suitable for physically securing the cable loop 1000. As an option, the cable fastener 1108 may be a hook-and-loop strap, a cable tie, string, cord, etc.

Figure 11:
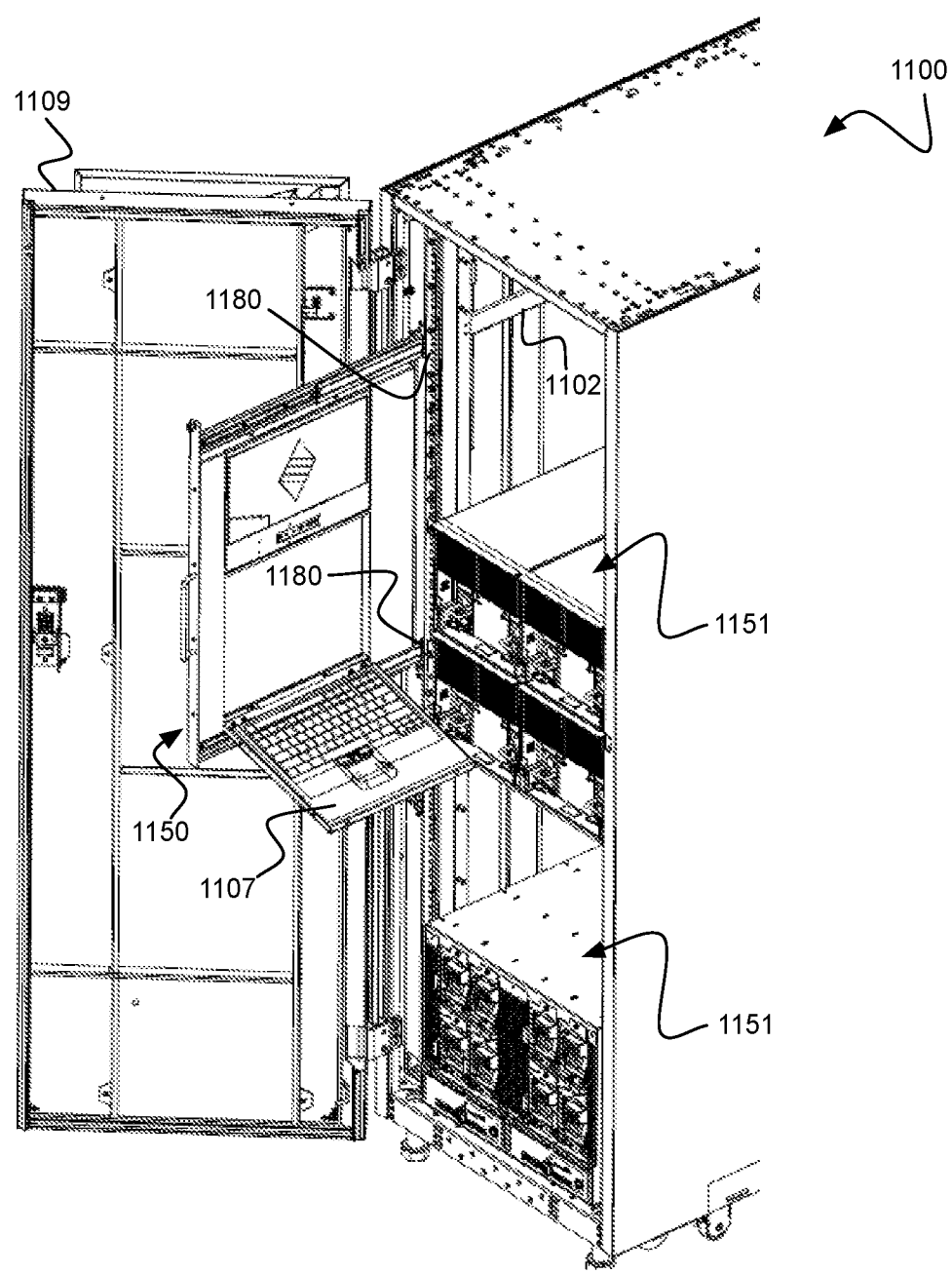
FIG. 11 illustrates a server rack, according to one embodiment.

FIG. 11 depicts a server rack 1100 including a retractable terminal, in accordance with one embodiment. As an option, the server rack 1100 may be implemented in conjunction with features from any other embodiment listed herein, such as those described with reference to the other FIGS. Of course, however, such server rack 1100 and others presented herein may be used in various applications and/or in permutations which may or may not be specifically described in the illustrative embodiments listed herein. Further, the server rack 1100 presented herein may be used in any desired environment.

As shown in FIG. 11, various computer and network hardware 1151 are mounted (e.g., on rails) within the server rack 1100. The server rack 1100 includes a retractable terminal 1150. The retractable terminal 1150 includes a display and input device 1107. Moreover, the retractable terminal 1150 extends from, and retracts into, the server rack 1100 along one or more fixed rails 102. The server rack 1100 is further shown to include a door 1109. When the retractable terminal 1150 is stowed within the server rack 1100 such that the retractable terminal 1150 is within or generally parallel to a sidewall the server rack 1100, the door 1109 may be closed and locked.

Still yet, in some embodiments, when the retractable terminal 1150 is extended, the retractable terminal 1150 may articulate in an arc generally parallel to the ground along hinges 1180. Articulation of the retractable terminal 1150 via the hinges 1180 may facilitate access to the computer and network hardware 1151 within the server rack 1100. For example, by rotating the retractable terminal 1150 towards the door 1109, input devices and other elements of the retractable terminal 1150 may be moved away from a front face of the server rack 1100, thereby providing improved access to the contents within the server rack 1100.

It will be clear that the various features of the foregoing systems and/or methodologies may be combined in any way, creating a plurality of combinations from the descriptions presented above.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A server rack, comprising: a sidewall: an aperture in the sidewall: a retractable terminal configured to extend through the aperture of the sidewall: at least one fixed rail within the sidewall, the terminal being slidably mounted to the at least one fixed rail: and a cable bracket attached to one of the fixed rails, wherein the cable bracket is immovable and mounted directly on one of the fixed rails whereby the retractable terminal is movable without moving the cable bracket; wherein the retractable terminal includes sliding rails configured to slide along the at least one fixed rail in a direction parallel to the sidewall.

2. The server rack as recited in claim 1, wherein the retractable terminal includes an input device.

3. The server rack as recited in claim 2, wherein the input device includes a mouse.

4. The server rack as recited in claim 2, wherein the retractable terminal includes a display.

5. The server rack as recited in claim 2, wherein the input device includes a touch screen device.

6. The server rack as recited in claim 1, wherein the retractable terminal includes a handle for sliding the sliding rails of the retractable terminal from a position within the sidewall, through the aperture, to a position outside the sidewall.

7. The server rack as recited in claim 6, comprising at least one stopper plate; a door; and computing hardware, wherein the door is pivotable to cover the aperture when the door is in a closed position, wherein the door is positioned to prevent sliding of the rails of the retractable terminal from the position within the sidewall to the position outside the sidewall when the door is in a closed position, wherein the handle is covered by the door when the door is closed, wherein each of the stopper plates is attached to one of the fixed rails, and wherein each of the stopper plates is mounted to the sidewall; an input device, wherein the input device is mounted to a panel of the retractable terminal, wherein the input device is pivotally mounted to the panel, wherein the input device includes a keyboard, wherein the keyboard deploys into a different plane than a plane that the keyboard resides in while undeployed; a cable loop extending between the retractable terminal and the cable bracket, wherein the cable loop is unsupported along a length of the cable loop that extends between at least the retractable terminal and the immovable cable bracket, wherein the at least one cable is selected from a group of cables consisting of: power cables, data cables, network cables and video cables; wherein the panel and the input device of the retractable terminal include the computing hardware; and a display, wherein the display is fixedly mounted to the retractable terminal, wherein a screen of the display is oriented about parallel to the plane that the keyboard resides in while the keyboard is undeployed.

8. The server rack as recited in claim 7, comprising: a rear bracket, wherein a longitudinal axis of the rear bracket is oriented in a plane which is perpendicular to a direction in which the retractable terminal is configured to extend, wherein the at least one fixed rail is directly fixably mounted to the rear bracket, wherein a longitudinal axis of the at least one fixed rail is oriented parallel to the direction in which the retractable terminal is configured to extend, wherein the cable bracket is closer to the rear bracket than the cable bracket is to the retractable terminal when the retractable terminal is fully extended through the aperture of the sidewall, wherein each of the fixed rails includes a mushroom pin, wherein the rear bracket includes at least one notch, wherein the mushroom pins is seated within the notches.

9. The server rack as recited in claim 1, comprising:
a rear bracket; and
wherein the at least one fixed rail is directly fixably mounted to the rear bracket.

10. The server rack as recited in claim 9, wherein each of the fixed rails includes a mushroom pin, wherein the rear bracket includes at least one notch, and wherein the mushroom pins is seated within the notches.

11. The server rack as recited in claim 1, comprising a door pivotably coupled to the sidewall, wherein the door is pivotable to cover the aperture when the door is in a closed position.

12. The server rack as recited in claim 1, comprising:
at least one stopper plate, wherein each of the stopper plates is attached to one of the fixed rails, and wherein each of the stopper plates is mounted to the sidewall.

13. A server rack, comprising: a sidewall; an aperture in the sidewall; a first fixed rail within the sidewall; a second fixed rail within the sidewall; and a retractable terminal configured to slidably extend along a straight line through the aperture of the sidewall, wherein the retractable terminal includes a display and a keyboard, wherein the keyboard deploys into a different plane than a plane that the keyboard resides in while undeployed, wherein the display is nonpivotally mounted in the retractable terminal; wherein the retractable terminal includes sliding rails configured to slide through the aperture along the first fixed rail and the second fixed rail; and wherein an immovable cable bracket mounted directly on one of the fixed rails and a cable extending from the retractable terminal to the cable bracket.

14. The server rack as recited in claim 13, wherein the retractable terminal includes a touch screen.

15. The server rack as recited in claim 13, wherein a screen of the display is oriented about parallel to the plane that the keyboard resides in while the keyboard is undeployed.

16. The server rack as recited in claim 15, wherein the retractable terminal includes computing hardware.

17. The server rack as recited in claim 13, comprising a door,
wherein the door is pivotable to cover the aperture when the door is in a closed position, wherein the door is positioned to prevent sliding of the retractable terminal through the aperture.

* * * * *